United States Patent
Tunga et al.

(10) Patent No.: US 11,282,773 B2
(45) Date of Patent: Mar. 22, 2022

(54) ENLARGED CONDUCTIVE PAD STRUCTURES FOR ENHANCED CHIP BOND ASSEMBLY YIELD

(71) Applicant: International Business Machines Corporation, Armonk, NY (US)

(72) Inventors: Krishna R. Tunga, Wappingers Falls, NY (US); Thomas Weiss, Poughkeepsie, NY (US); Charles Leon Arvin, Poughkeepsie, NY (US); Bhupender Singh, Fishkill, NY (US); Brian W. Quinlan, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/845,404

(22) Filed: Apr. 10, 2020

(65) Prior Publication Data
US 2021/0320056 A1    Oct. 14, 2021

(51) Int. Cl.
| | | |
|---|---|---|
| *H01L 23/498* | (2006.01) | |
| *H01L 23/538* | (2006.01) | |
| *H01L 21/50* | (2006.01) | |
| *H01L 23/00* | (2006.01) | |
| H01L 21/60 | (2006.01) | |

(52) U.S. Cl.
CPC ........ *H01L 23/49816* (2013.01); *H01L 21/50* (2013.01); *H01L 23/5385* (2013.01); *H01L 23/5386* (2013.01); *H01L 23/562* (2013.01); *H01L 24/14* (2013.01); *H01L 2021/60225* (2013.01)

(58) Field of Classification Search
None
See application file for complete search history.

(56) References Cited

U.S. PATENT DOCUMENTS

| | | |
|---|---|---|
| 5,641,946 A | 6/1997 | Shim |
| 6,443,351 B1 | 9/2002 | Huang et al. |
| 6,750,549 B1 | 6/2004 | Chandran et al. |
| 8,076,762 B2 | 12/2011 | Chandrasekaran et al. |
| 8,152,048 B2 | 4/2012 | Zu |
| 8,604,614 B2 | 12/2013 | Kwon et al. |
| 8,952,532 B2 | 2/2015 | Zheng et al. |
| 9,312,237 B2 | 4/2016 | Zheng et al. |
| 9,368,437 B2 | 6/2016 | Ganesan et al. |
| 9,922,916 B2 | 3/2018 | Ganesan et al. |

(Continued)

FOREIGN PATENT DOCUMENTS

KR       101131138 B1      4/2012

*Primary Examiner* — Bo B Jang
(74) *Attorney, Agent, or Firm* — Cantor Colburn LLP; Tihon Poltavets

(57) ABSTRACT

An electrical device includes an electrically insulating body having an insulating body surface and a conductive pad array, a small conductive pad arranged on the insulating body surface and within the conductive pad array, and an enlarged conductive pad. The enlarged conductive pad is arranged on the insulating body and within the conductive pad array, wherein the enlarged conductive pad is spaced apart from the small conductive pad and is larger than the small conductive pad. C4 assemblies and methods of making C4 assemblies including the electrical device are also described.

13 Claims, 5 Drawing Sheets

(56) References Cited

U.S. PATENT DOCUMENTS

| | | | |
|---|---|---|---|
| 10,204,851 B2 | 2/2019 | Ganesan et al. | |
| 2007/0152350 A1 | 7/2007 | Kim et al. | |
| 2008/0054455 A1 | 3/2008 | Tsao et al. | |
| 2011/0100692 A1 | 5/2011 | Topacio et al. | |
| 2011/0233771 A1* | 9/2011 | Kwon | H01L 23/49838 257/737 |
| 2014/0138823 A1 | 5/2014 | Zhang et al. | |
| 2014/0217579 A1 | 8/2014 | Ganesan et al. | |
| 2014/0332956 A1* | 11/2014 | Zheng | H01L 23/49811 257/738 |
| 2018/0182696 A1 | 6/2018 | Ganesan et al. | |
| 2019/0172778 A1 | 6/2019 | Ganesan et al. | |

* cited by examiner

ENLARGED CONDUCTIVE PAD STRUCTURES FOR ENHANCED CHIP BOND ASSEMBLY YIELD

BACKGROUND

The present invention generally relates to electrical assemblies, and more particularly to electrical assemblies having integrated circuit die connected to printed circuit boards by pad arrays having enlarged conductive pads.

Semiconductor chips, commonly referred to integrated circuit (IC) chips or die, are commonly formed with interconnect pads to provide electrical communication with the IC chip. The interconnect pads are generally formed during back end of line (BEOL) operations during which various electrical structures are defined within the IC chip and overlaying the semiconductor substrate upon which the circuitry is formed. Once the formation of semiconductor devices and interconnects on a semiconductor wafer is completed, the semiconductor wafer is commonly diced into individual semiconductor chips and are assembled onto the substrate using solder interconnects. The solder interconnects are formed during a far back end of line (FBEOL) integration operation, typically by interconnecting pads located on the substrate surface and on the surface of the semiconductor chip.

Solder interconnects are commonly formed using Controlled Collapse Chip Connection (C4) techniques. C4 techniques generally entail attaching round solder bumps ("C4s") are attached to a top surface of the semiconductor chip. The semiconductor chip and substrate are then positioned such that the solder bump IC chip and solder bumps is soldered to solder pads located along a surface of the substrate and an electrically conductive solder joint between the chip and the substrate. Establishing the solder joint typically entails heating the substrate and the semiconductor chip, which causes the semiconductor chip and the substrate to bow according the coefficient of thermal expansion (CTE) of the semiconductor chip and the substrate. The bow typically corresponds to the mismatch in CTE between the structures formed during the BEOL operations and the underlying silicon substrate. The resulting IC chip warpage increases the risk of non-wets at the perimeter of the IC chip, potentially requiring employment of stiffeners to limit warpage of the IC chip and/or the substrate, vacuum fixturing with mass reflow, and/or thermal compression bonding during formation of the solder interconnects.

SUMMARY

Embodiments of the present disclosure are directed to an electrical device. The electrical device includes an electrically insulating body having an insulating body surface and a conductive pad array, a small conductive pad arranged on the insulating body surface and within the conductive pad array, and an enlarged conductive pad. The enlarged conductive pad is arranged on the insulating body and within the conductive pad array, wherein the enlarged conductive pad is spaced apart from the small conductive pad and is larger than the small conductive pad.

Embodiments of the present disclosure are also directed to Controlled Collapse Chip Connection (C4) assemblies. The C4 assembly includes an electrically insulating body having an insulating body surface and a conductive pad array, a small conductive pad arranged on the insulating body surface and within the conductive pad array, and an enlarged conductive pad. The enlarged conductive pad is arranged on the insulating body and within the conductive pad array, wherein the enlarged conductive pad is spaced apart from the small conductive pad and is larger than the small conductive pad. The pad array has a center and a corner, and the enlarged conductive pad is arranged between the center of the pad array and the corner of the pad array. A first solder ball is fixed to the small conductive pad and one or more second solder ball is fixed to the enlarged conductive pad.

Embodiments of the present disclosure are additionally directed to methods of making C4 assemblies. The method includes, at an electrical device as described above, arranging a first solder ball on the small conductive pad, arranging at least one second solder ball on the enlarged conductive pad, and warping the electrical device by heating the electrical device to (or above) a reflow temperature of solder forming the first solder ball and the at least one second solder ball. The warpage of the electrical device is reduced by with a pulling force communicated through the at least one second solder ball that is exerted on the insulating body and through the enlarged conductive pad while the electrical device is at (or above) the reflow temperature of the solder.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
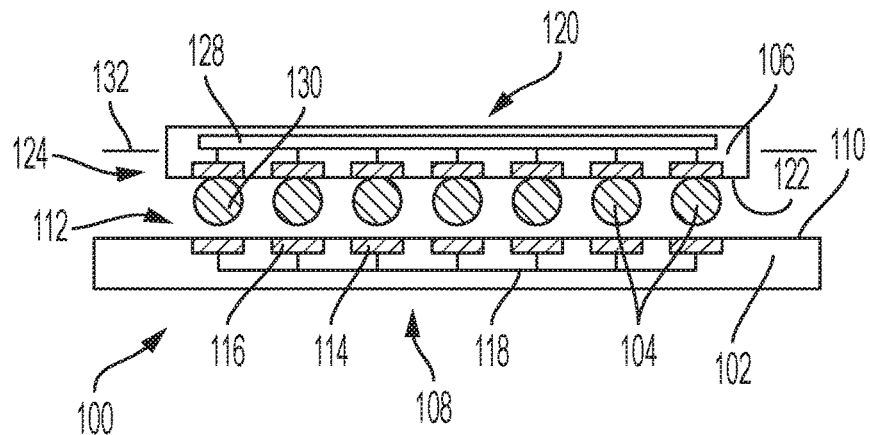
FIG. 1 depicts an example of a C4 assembly including an integrated circuit (IC) die having a nominal profile, solder balls fixed to the IC die conductive pads of the IC die, and an underlying printed circuit board (PCB) having small and enlarged conductive pads in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular reflow system, embodiments of the invention are not limited to the particular architectures or materials described in this specification. Rather, embodiments of the present invention are capable of being implemented in conjunction with any other type of reflow systems now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, a back-end-of-line (BEOL) stage, and a far-back-end-of-line (FBEOL) stage. The process flows for fabricating modern ICs are often identified based on whether the process flows fall in the FEOL stage, the MOL stage, the BEOL stage, or the FBEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contact structures and other structures that communicatively couple to active regions (e.g., gate, source, and drain) of the device element. Most ICs need more than one layer of wires to form all the necessary connections, and as many as 5-12 layers are added in the BEOL process. The various BEOL layers are interconnected by via structures that couple from one layer to another.

During the FBEOL, solder bumps are arranged on conductive pads defined on the outer surface of the IC die. The semiconductor wafer is then diced into individual IC die and the individual IC dies assembled on to an insulating body having corresponding conductive pads, e.g., printed circuit board (PCB), typically using a Controlled Collapse Chip Connection (C4) technique. C4 techniques generally entail flipping (i.e. inverting) the IC die such that the solder balls face the insulating body and registering the solder balls with the conductive pads of the located on the insulating body. The IC die, the solder balls, and the insulating body are then heated to (or above) a reflow temperature of the solder forming the solder balls. The heating causes the solder forming the solder to flow across the conductive pads on the insulating substrate and, once solidified, provide electrical communication between the IC die and the conductive pads on the insulating body and/or wire trace(s) contained within the insulating body.

In some cases, the heating operation introduces warpage into the IC die and/or the insulating body to which the IC die is being affixed. Warpage can result, for example, due to mismatch between the coefficient of thermal expansion (CTE) between the silicon upon which the FEOL structures are formed and the layers overlaying the FEOL structures formed during the BEOL and defining the interconnect structure in electrical communication with the FEOL structure.

In some electrical devices warpage of the IC die can be such that non-wets form between IC die and the printed circuit board (PCB) supporting the IC die. Non-wets are high-resistance and/or opens formed by solder balls between the IC die and the (PCB). For example, when the heating warps the IC chip into a concave shape the edges of the IC die tend to be spaced further from the surface of the PCB than the center of the IC die, increasing likelihood that solder balls located at the periphery of the IC die. And in electrical assemblies where the PCB insulating body warps in an opposite direction (e.g., into a concave shape) due to mismatch in CTE between the insulating body and a wiring trace contained within the insulating body, non-wet risk can be severe. And while non-wets can sometimes be repaired, inspection and rework operations add time and cost to the manufacture of electrical assemblies.

Various techniques exist and/or are contemplated to limit the risk of non-wets in electrical assemblies. For example, vacuum fixturing and mass reflow techniques can be employed for certain electrical assemblies. Such techniques can be effective for electrical assemblies having relatively thin electrically insulating bodies, e.g., electrically insulating bodies having thicknesses of 1 millimeter and smaller. No-wet risk reduction tends to be smaller (or negligible) in electrical assemblies employing thicker substrates, such as in PCB assemblies employed for servers. Stiffeners can also be employed to limit warpage. However, stiffeners can be difficult to fabricate due the required coefficient of thermal expansion and compete for space on the surface of the insulating substrate otherwise available for surface mount components (e.g., decoupling capacitors and/or WLCSP packages) and can adversely impact the electrical performance of the electrical assembly. A further approach offering some advantages is thermal compression bonding. Thermal compression bonding is, however, relatively immature as a C4 process, has low throughput, and results in solder connections with unknown intermetallic (solder ball-to-conductive pad) strength.

Turning now to an overview of aspects of the present invention, one or more embodiments of the invention address one or more of the above-described shortcomings of the prior art by providing enlarged conductive pads on the electrically insulating body, e.g., on either (or both) the IC die and the PCB supporting the IC die. At reflow temperatures, surface tension exists within the molten solder of the solder ball. Further, as the magnitude of the surface tension of the molten solder within a given solder ball is a function (at least in part) of the area of the underlying conductive pad, selective placement of the enlarged conductive pads on the electrically insulating body surface can exert forces on the IC die limiting (and in some examples eliminating entirely) warpage associated with heating the IC die to (or above) the reflow temperature of the solder forming the solder balls. As will be appreciated by those of skill in the art in view of the present disclosure, limiting (or eliminating entirely) IC die warpage limits (or eliminates entirely) non-wet risk in the electrical assembly.

In one or more embodiments of the present invention, the enlarged conductive pads are arranged between the center of the IC die and the periphery of the IC die. So positioned, the enlarged conductive pads tend to pull solder balls positioned between the enlarged conductive pad and the periphery of the pad array into engagement with smaller conductive pads arranged between the enlarged conductive pad the periphery of the pad array, the C4 assembly thereby zipping itself together from the center of the pad array outward. In accordance with one or more embodiments of the present invention, the enlarged pads are symmetrically placed in each of four quadrants defined about the center of the die, the zipping effect thereby occurring in each of the four quadrants of the pad array. It is contemplated that the enlarged pads can receive two or more molten solder balls, the added solder of the two or more solder balls on the enlarged pad increasing force exerted on the IC die and opposing the warpage of the IC die. It is also contemplated that, in accordance with one of more embodiments, that the pads be circular, oval, rectangular, and/or rectangular with filleted corners, such shapes allowing for relatively small spacing between the enlarged conductive pads and neighboring small conductive pads.

Advantageously, the enlarged conductive pads reduce (or eliminate entirely) the likelihood of non-wets at opposing conductive pads between the IC die and the insulating body that at the periphery of the IC die and insulating body overlap. Further, as the enlarged conductive pad is located only in the topmost layer of the insulating body and/or IC die, implementation of the enlarged conductive pads requires only a limited change to the process flow of the insulating body and/or the IC die. Moreover, the enlarged conductive pads limit spacing between the IC die and the insulating body in electrical device where heating the electrical device to the solder reflow temperature results in mismatched warpage, e.g., the IC die warping into a convex profile while the insulating substrate assumes a concave profile, thereby reducing non-wet risk in electrical devices tending to have the greatest risk of non-wet solder connections.

Turning now to a more detailed description of one or more embodiments, of the present invention, FIGS. 1-4 depict a C4 assembly 100. As shown in FIG. 1, the C4 assembly 100 includes a first electrical device 102, a plurality of solder balls 104, and a second electrical device 106.

The first electrical device 102 has an electrically insulating body 108 with an insulating body surface 110 and a conductive pad array 112. The conductive pad array 112 includes a small conductive pad 114 and an enlarged conductive pad 116. The small conductive pad 114 and the enlarged conductive pad 116 are arranged on the insulating body surface 110 and within the conductive pad array 112. The enlarged conductive pad 116 is spaced apart from the small conductive pad 114 and is larger than the small conductive pad 114 for limiting (or eliminating entirely) risk of non-wets between first electrical device 102 and the second electrical device 106.

In the illustrated embodiment the electrically insulating body 108 is a laminated printed circuit board (PCB). As also shown in the illustrated embodiment, the electrically insulating body 108 contains a wiring trace 118. The wiring trace 118 is electrically connected to the small conductive pad 114 and/or the enlarged conductive pad 116 of the conductive pad array 112 for electrical communication therethrough with the second electrical device 106. Although the conductive pad array 112 is shown and described herein as having seven (7) conductive pads, it is to be understood and appreciated that C4 assemblies can have electrical devices with fewer than seven (7) conductive pads or more than seven (7) conductive pads and remain within the scope of the present disclosure.

Figure 4:
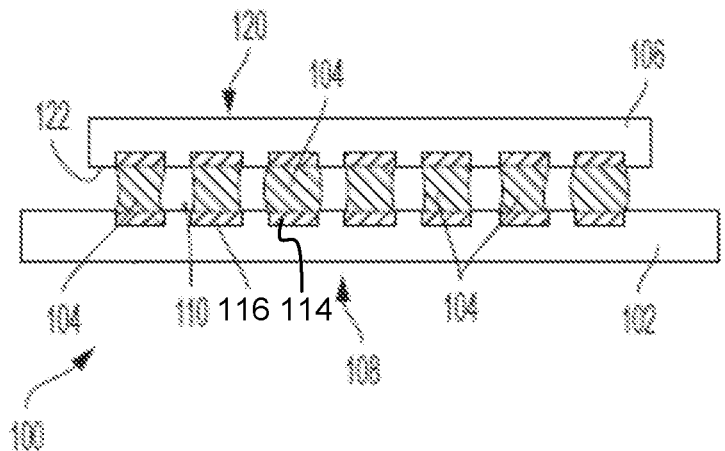
FIG. 4 depicts the C4 assembly according to the example subsequent to cooling the C4 assembly and solidifying the solder balls to form solder connections between the IC die and the PCB in accordance with one or more embodiments of the present invention.

The second electrical device 106 has an electrically insulating body 120 with an insulating body surface 122 and a conductive pad array 124. The conductive pad array 124 includes a plurality of conductive pads 126 arranged on the insulating body surface 122. In the illustrated embodiment the electrically insulating body 120 is an integrated circuit die having an integrated circuit 128 that, as shown in FIG. 4, is electrically connected to the small conductive pad 114 and the enlarged conductive pad 116 through the solder balls 104.

The solder balls 104 are formed from a solder material 130, e.g., a lead-free material, and are arranged between the insulating body surface 110 of the first electrical device 102 and the insulating body surface 122 of the second electrical device 106. It is contemplated that the solder balls 104 connect the first electrical device 102 to the second electrical device 106. In this respect the solder balls 104 electrically connect the conductive pad array 112 of the first electrical device 102, e.g., the small conductive pad 114 and the enlarged conductive pad 116, to the conductive pad array 124 of the second electrical device 106. In one or more embodiments the electrical connectivity is established using a flip-chip technique and/or a C4 technique. In this respect, as shown in FIG. 1, the solder balls 104 are distributed on the second electrical device 106 and fixed to conductive pads of the conductive pad array 124.

Figure 2:
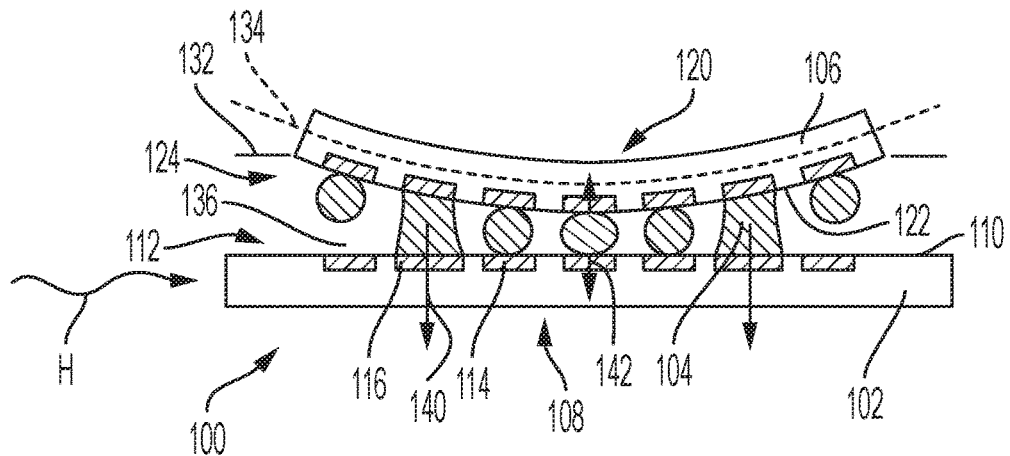
FIG. 2 depicts the example C4 assembly being heated to (or above) a reflow temperature of solder forming the solder balls, the IC warping due to the heating, and the enlarged conductive pads pulling the IC die toward the PCB through the molten solder in accordance with one or more embodiments of the present invention.
Figure 3:
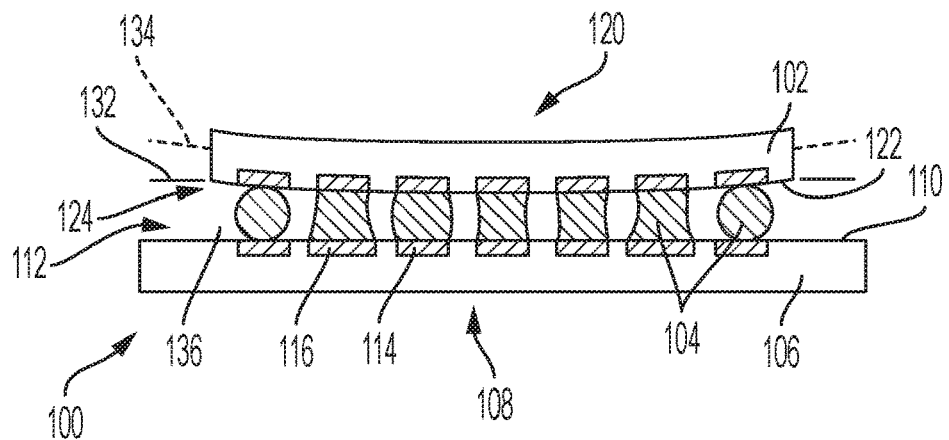
FIG. 3 depicts warpage of the IC die being reduced by the pull of the enlarged conductive pads such that solder balls about the periphery of the IC die wetting small conductive pads arranged about the periphery of a pad array on the PCB in accordance with one or more embodiments of the present invention.

As shown in FIG. 2, the second electrical device 106 is registered to the first electrical device 102 such that the conductive pad array 124 of the second electrical device 106 overlay the conductive pads of the conductive pad array 112 of the first electrical device 102. The C4 assembly 100 is then heated to a temperature at (or above) a reflow temperature of the solder material 130. As shown in FIG. 3, heating the C4 assembly 100 causes the solder of the solder balls to flow across the conductive pads of the conductive pad array 112 of the first electrical device 102, e.g., the small conductive pad 114 and the enlarged conductive pad 116. As shown in FIG. 4, the solder material 130 is then cooled such that the solder balls 104 solidify between the first electrical device 102 and the second electrical device 106 such that the second electrical device 106 is in electrical communication with the first electrical device 102 through the solder balls 104.

With continuing reference to FIG. 2, heating the C4 assembly 100 to connect the solder balls 104 to the first electrical device 102 warps the second electrical device 106. Specifically, heating the C4 assembly causes the second electrical device 106 to define a concave profile 134 relative to a nominal profile 132 (shown in FIG. 1) prior to heating. The concave profile 134 increases separation between the second electrical device 106 and the first electrical device 102 at a periphery 136 of the second electrical device 106. The increased separation in turn increases risk that solder balls located at the edges of the conductive pad array 124 of the second electrical device 106 will fail to wet the underlying conductive pad, e.g., of the conductive pad array 112 of the first electrical device 102, potentially causing non-wets at these locations.

The enlarged conductive pad 116 limits (or eliminates entirely) non-wet risk at the periphery 136 of the conductive pad array 112. Specifically, heating the solder balls 104 to (or above) the reflow temperature of the solder material 130 forming the solder balls 104 causes the solder material 130 to flow across the conductive pads of the conductive pad array 112. The relatively large surface area of the enlarged conductive pad 116 generates an enlarged conductive pad pulling force 140 that is greater than a small conductive pad pulling force 142 generated by the small conductive pad 114 (and in certain examples oppositely directed), pulling the second electrical device 106 toward the first electrical device 102 and attenuating the concave profile 134 otherwise associated with the heating of the second electrical device 106.

As shown in FIG. 3, the pulling force causes the second electrical device 106 to define an attenuated concave profile 144, reducing the separation distance at the periphery 136 of the second electrical device 106 and the risk of non-wets at the periphery 136. As shown in FIG. 4, the C4 assembly 100 is thereafter permitted to cool, solidifying the solder balls 104 such that the each of the solder balls 104 provide electrical communication between the conductive pad array 112 of the first electrical device 102 and the conductive pad array 112 of the second electrical device 106.

Figure 5:
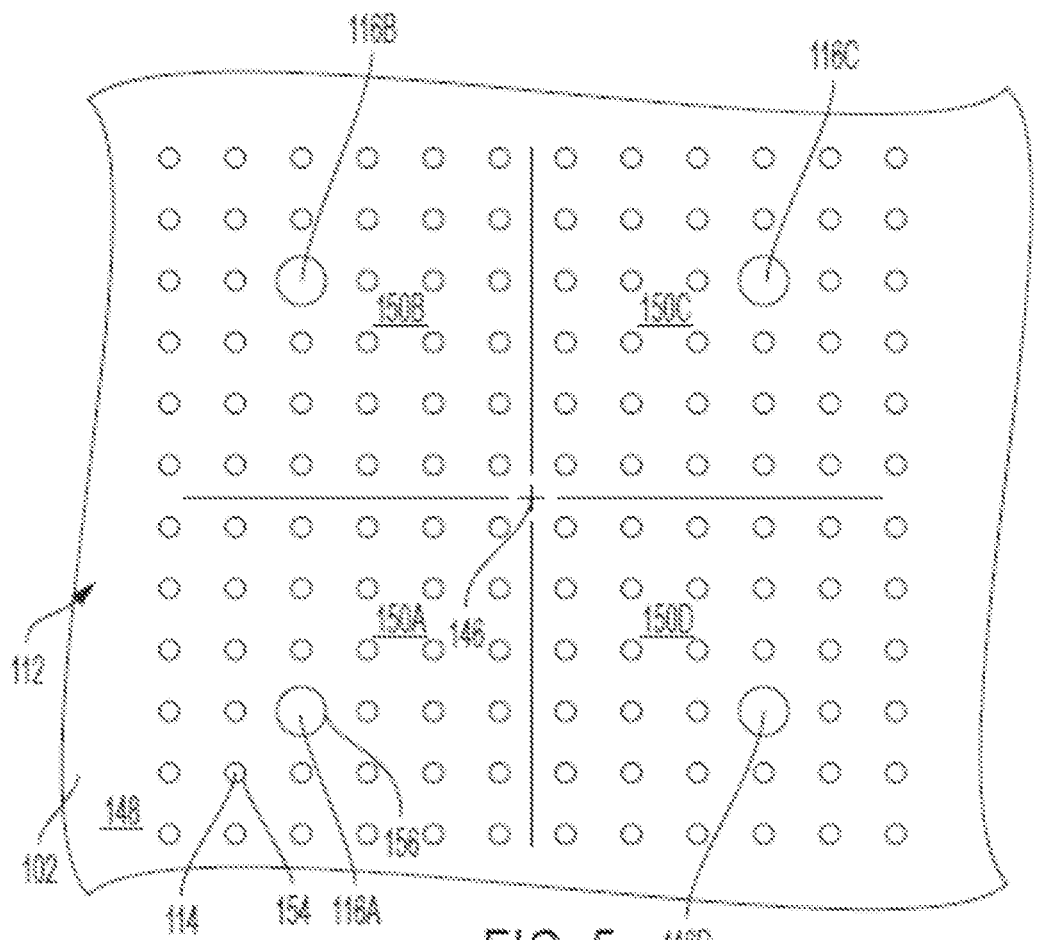
FIG. 5 depicts a pad array defined on a mounting surface of the PCB having enlarged pads with a circular shape in accordance with one or more embodiments of the present invention.
Figure 6:
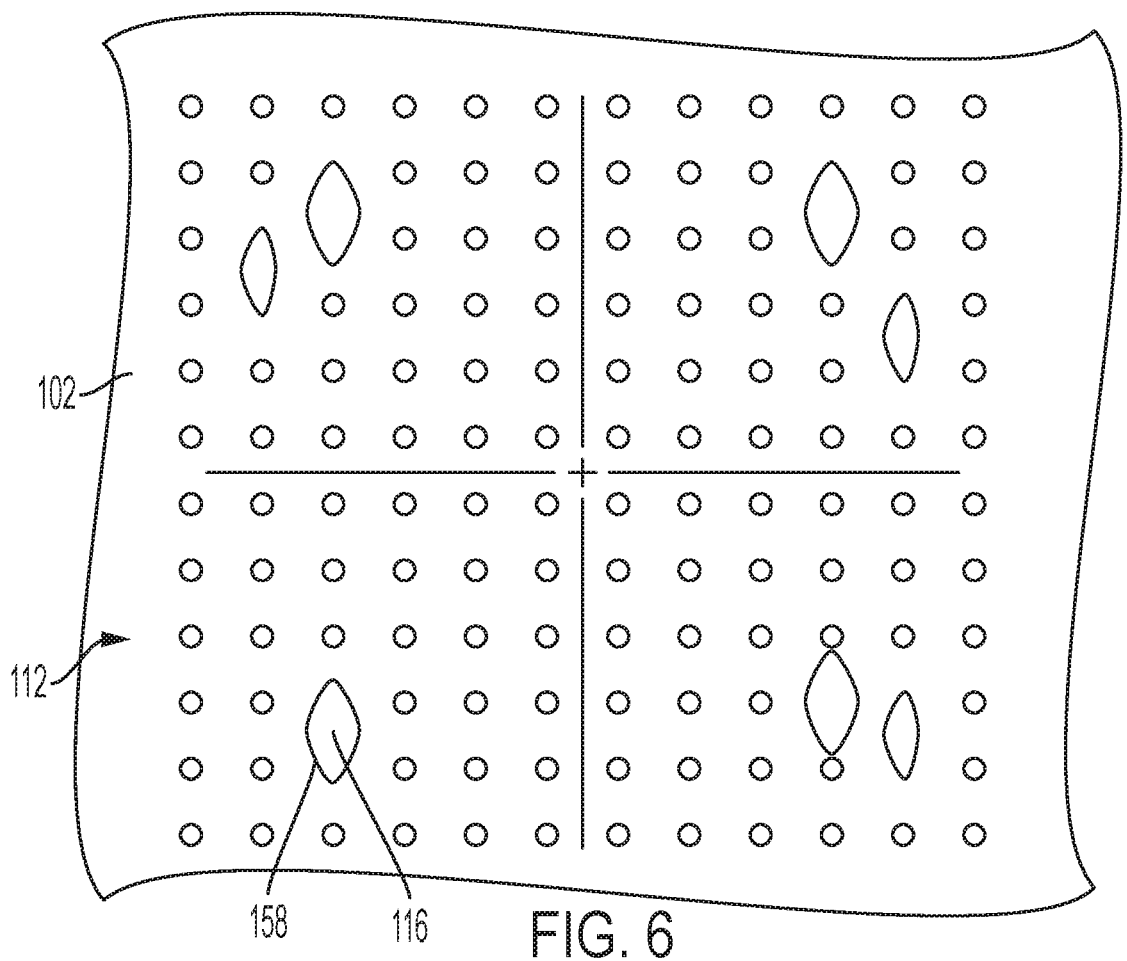
FIG. 6 depicts a pad array defined on a mounting surface of the PCB having enlarged pads with an elliptical shape in accordance with one or more embodiments of the present invention.
Figure 7:
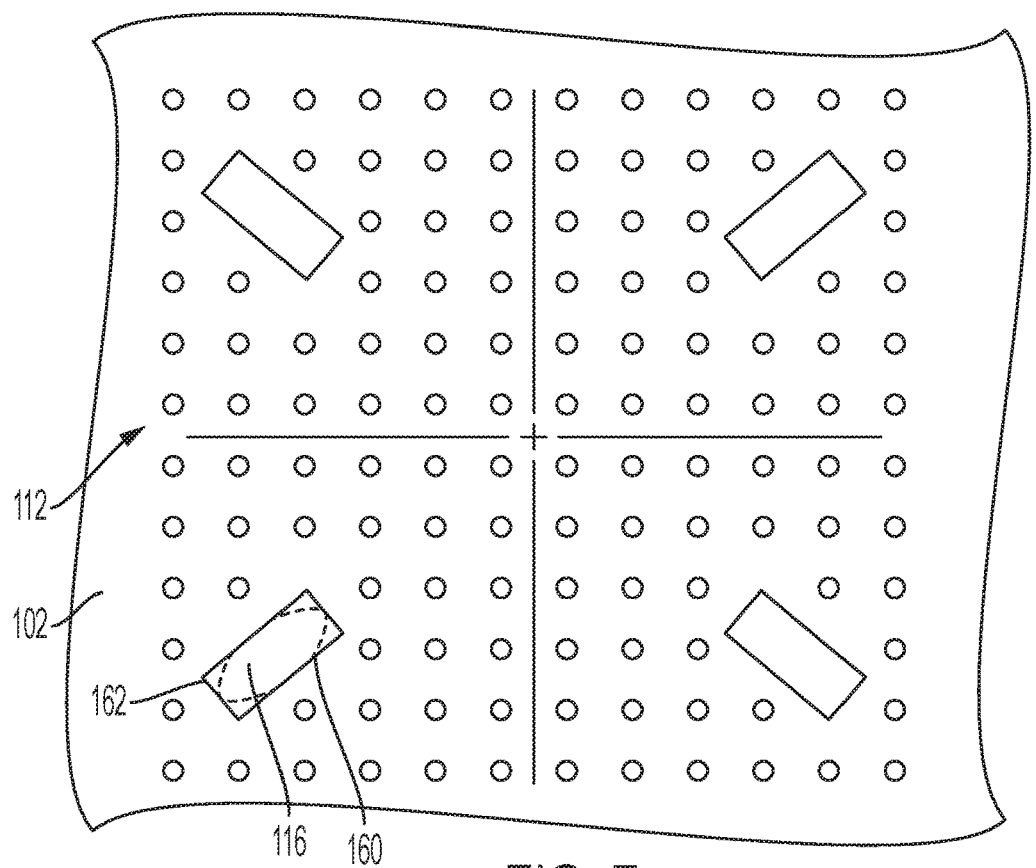
FIG. 7 depicts a pad array defined on a mounting surface of a PCB having enlarged pads with a rectangular shape in accordance with one or more embodiments of the present invention.

With reference to FIGS. 5-7, the conductive pad array 112 of the first electrical device 102, e.g., a PCB, is shown according to examples. As shown in FIG. 5, the conductive pad array 112 has a center 146 and a corner 148, and the enlarged conductive pad 116 is arranged between the center 146 and the corner 148 of the conductive pad array 112. As also shown in FIG. 5, the conductive pad array 112 has four quadrants 150A-150D, and the four quadrants 150A-150D are distributed about the center 146 of the conductive pad array 112. Each of the four quadrants 150A-150D include an enlarged conductive pad 116A-116D. The enlarged conductive pads 116A-116D are arranged within each of each of the four quadrants 150A-150D and distributed symmetrically about the center 146 of the conductive pad array 112.

In one or more embodiments the small conductive pad 114 has a circular shape 154. In accordance with one or more embodiments, the enlarged conductive pad 116 has a circular shape 154. It is also contemplated that the enlarged conductive pad 116 can have a circular shape 156. As shown in FIG. 6, the enlarged conductive pad 116 can have an elliptical shape 158. As shown in FIG. 7, the enlarged conductive pad 116 can have a rectangular shape 160. The rectangular shape 160 can, in one or more embodiments, have filleted corners 162.

Figure 8:
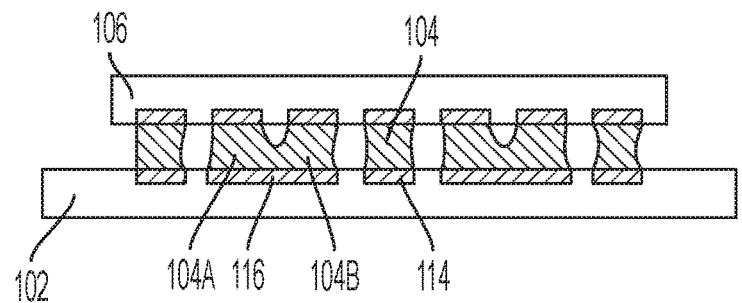
FIG. 8 depicts a C4 assembly according to an example having two solder balls solidified to a singular enlarged conductive pad on the PCB mounting surface in accordance with one or more embodiments of the present invention.
Figure 9:
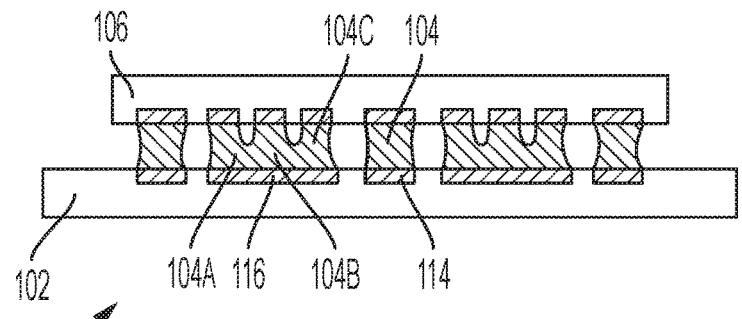
FIG. 9 depicts a C4 assembly according to an example having three solder balls solidified to a singular enlarged conductive pad on the PCB mounting surface in accordance with one or more embodiments of the present invention.
Figure 10:
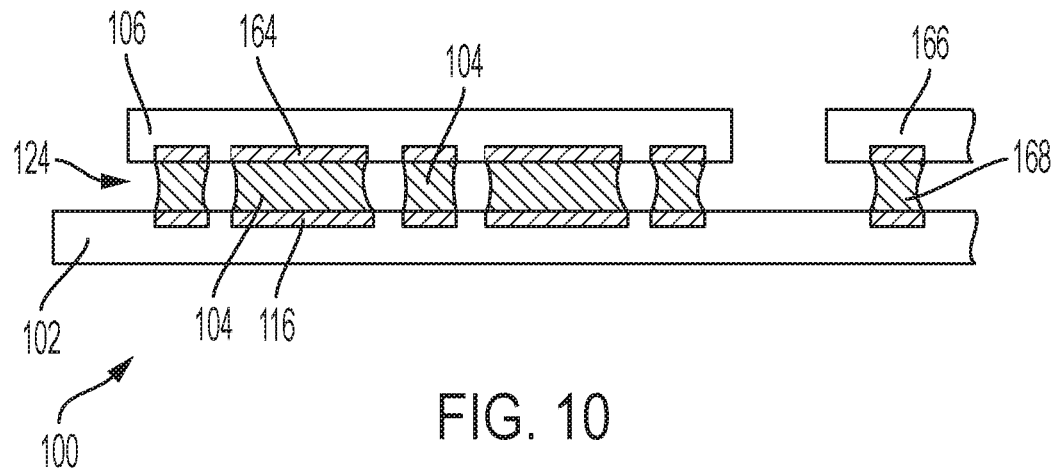
FIG. 10 depicts the C4 assembly according to an example showing an IC die having IC die enlarged conductive pads in accordance with one or more embodiments of the present invention.

With reference to FIGS. 4 and 8-10, it is contemplated that the small conductive pads 114 of the conductive pad array 112 have a single solder ball 104 fixed to each of the small conductive pads 114. As shown in FIG. 4, the enlarged conductive pads 116 of the conductive pad array 112 can, in one or more embodiments, also have a single solder ball 104 fixed to the enlarged conductive pad 116. As shown in FIG. 8, the enlarged conductive pads 116 of the conductive pad array 112 can, in accordance with one or more embodiments, have two (2) solder balls 104A and 104B fixed to each of the enlarged conductive pad 116. As shown in FIG. 9, it is also contemplated that three (3) or more solder balls 104A-104C can be fixed to each of the enlarged conductive pads 116 of the conductive pad array 112. And as shown in FIG. 10, it also contemplated that the conductive pad array 124 of the second electrical device 106 can also include an enlarged conductive pad 164 and/or that a third electrical device 166 can be fixed to the first electrical device 102 by one or more solder ball 168.

Figure 11:
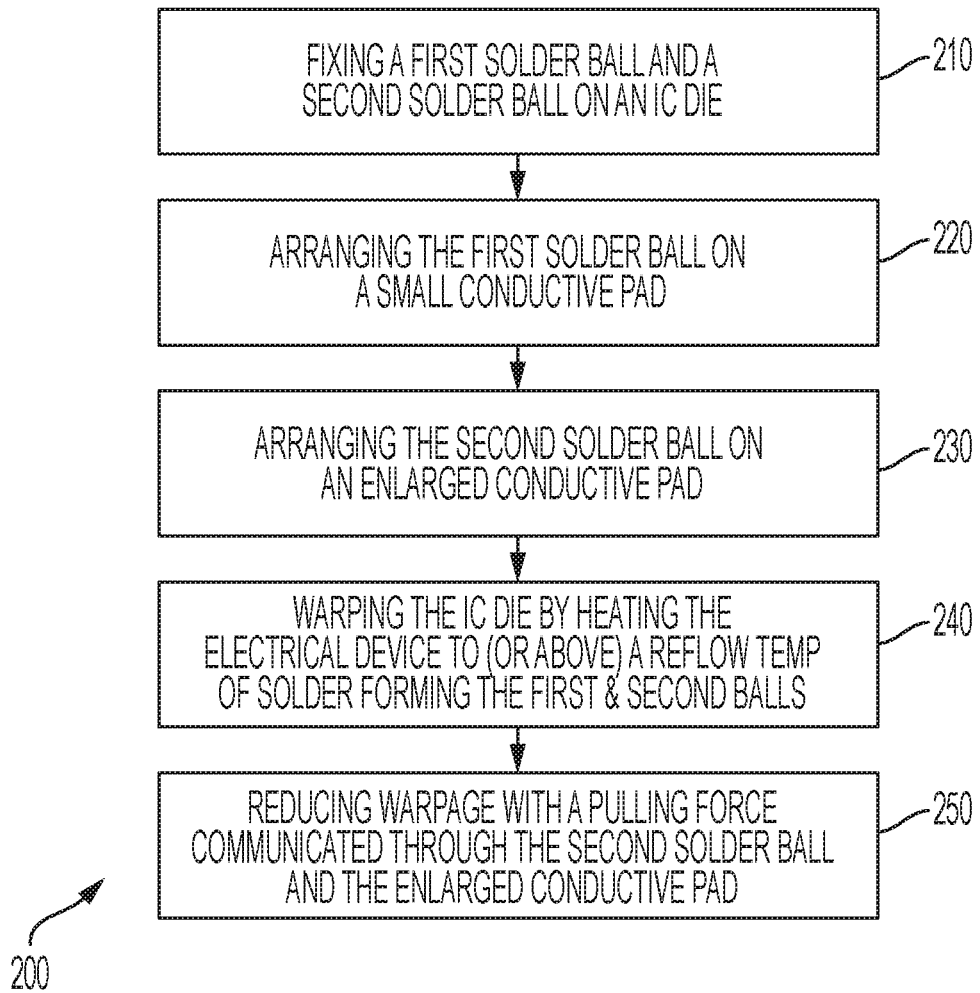
FIG. 11 depicts a method of making a C4 assembly in accordance with one or more embodiments of the present invention.

With reference to FIG. 11, a method 200 of making a C4 assembly, e.g., the C4 assembly 100 (shown in FIG. 1), is shown. The method 200 includes fixing a plurality of solder balls to an electrical device, e.g., fixing the solder balls 304 (shown in FIG. 1) to the conductive pad array 124 (shown in FIG. 1) of the second electrical device 106 (shown in FIG. 1), as shown with box 210. The plurality of solder balls are then arranged against a conductive pad array of a first electrical device, e.g., the conductive pad array 112 (shown in FIG. 1) of the first electrical device 102 (shown in FIG. 1). Specifically, a first of the plurality of solder balls is arranged against the small conductive pad and a second of the plurality of solder balls is arranged against the enlarged conductive pad of the conductive pad array of the first electrical device, as shown with box 220 and box 230.

As shown with box 240, the method 200 includes heating the C4 assembly. Specifically, the C4 assembly is heated to a temperature at (or above) the reflow temperature of solder forming the plurality of solder balls, e.g., the solder material 130 (shown in FIG. 2). It is contemplated that the second electrical device warp in response to the heating, as also shown with box 240. In this respect the second electrical device bows such that the electrical device defines a concave profile, e.g., the concave profile 134 (shown in FIG. 2), responsive to the heating relative to an unheated nominal profile, e.g., the nominal profile 132 (shown in FIG. 1), as further shown with box 240.

As shown with box 250, the method includes reducing warpage of the second electrical device. Specifically, the enlarged conductive pad a pulling force on the second electrical device, e.g., the enlarged conductive pad pulling force 140, through the solder ball wetting the enlarged conductive pad, as also shown with box 250. The pulling force attenuates the concave profile while the second electrical device is at (or above) the reflow temperature of the solder such that second electrical device defines an attenuated concave profile, e.g., the attenuated concave profile 144 (shown in FIG. 3).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A controlled collapse chip connection (C4) assembly comprising an electrical device, the electrical device comprising:
   an electrically insulating body having an insulating body surface and a conductive pad array;
   a small conductive pad arranged on the insulating body surface and within the conductive pad array;
   an enlarged conductive pad arranged on the insulating body surface and within the conductive pad array, wherein the enlarged conductive pad is spaced apart from the small conductive pad and is larger than the small conductive pad,
   wherein:
   the pad array has a center and a corner,
   the enlarged conductive pad is arranged between the center of the pad array and the corner of the pad array;
   a first solder ball is fixed to the small conductive pad and at least one second solder ball is fixed to the enlarged conductive pad,
   the electrically insulating body is a printed circuit board (PCB) and the C4 assembly further comprises at least one integrated circuit die with a small die conductive pad and an enlarged die conductive pad, and
   the first solder ball connects the small die conductive pad to the small conductive pad, and the at least one second solder ball connects the enlarged conductive pad to the enlarged die conductive pad.

2. The electrical device of the C4 assembly of claim 1, wherein the enlarged conductive pad is arranged between the center of the pad array and the corner of the pad array.

3. The electrical device of the C4 assembly of claim 1, wherein the pad array has the center and four quadrants distributed about the center, wherein the enlarged conductive pad is one of a plurality of enlarged conductive pads, and wherein the plurality of enlarged conductive pads are distributed symmetrically about the center of the pad array and within each of the four quadrants of the pad array.

4. The electrical device of the C4 assembly of claim 1, wherein the small conductive pad has a circular shape.

5. The electrical device of the C4 assembly of claim 1, wherein the enlarged conductive pad has a circular shape, an elliptical shape, a rectangular shape, or a rectangular shape with filleted corners.

6. The electrical device of the C4 assembly of claim 1, wherein the pad array has the center, and wherein the small pad is between the center of the pad array and the enlarged conductive pad.

7. The electrical device of the C4 assembly of claim 6, wherein the enlarged conductive pad is one of a plurality of enlarged conductive pads distributed symmetrically about the center of the pad array.

8. The electrical device of the C4 assembly of claim 6, wherein the pad array has four quadrants distributed about the center of the pad array, wherein the enlarged conductive pad is one of a plurality of enlarged conductive pads, wherein at least one of the plurality of enlarged conductive pads is arranged within each quadrant of the pad array and symmetrically within the pad array.

9. The electrical device of the C4 assembly of claim 1, wherein the pad array has a periphery, and wherein the small conductive pad is arranged between the periphery of the pad array and the enlarged conductive pad.

10. The electrical device of the C4 assembly of claim 1, wherein the electrically insulating body contains therein a wiring trace, wherein the wiring trace is electrically connected to at least one of the small conductive pad and the enlarged conductive pad.

11. The electrical device of the C4 assembly of claim 1, wherein the electrically insulating body is a laminated printed circuit board.

12. The C4 assembly of claim 1, wherein the electrically insulating body contains therein a wiring trace, wherein the wiring trace is electrically connected to at least one of the small conductive pad and the enlarged conductive pad, the C4 assembly further comprising an integrated circuit die electrically connected to the wiring trace by the first solder ball and the at least one second solder ball.

13. The C4 assembly of claim 1, wherein the electrically insulating body is an integrated circuit die containing therein an integrated circuit, wherein the integrated circuit is electrically connected to at least one of the small conductive pad and the enlarged conductive pad, and the C4 assembly further comprising a laminated printed circuit board electrically connected to the integrated circuit die by the first solder ball and the at least one second solder ball.

\* \* \* \* \*